March 17, 1959 D. D. HOLMES 2,878,380

PUSH-PULL SIGNAL AMPLIFIER

Filed Nov. 30, 1956 2 Sheets-Sheet 1

INVENTOR.
DAVID D. HOLMES

BY [signature]

ATTORNEY

PUSH-PULL SIGNAL AMPLIFIER

Filed Nov. 30, 1956 2 Sheets-Sheet 2

INVENTOR.
DAVID D. HOLMES
BY H. L. Newton
ATTORNEY 2,878,380
Patented Mar. 17, 1959

2,878,380

PUSH-PULL SIGNAL AMPLIFIER

David D. Holmes, Princeton, N. J., assignor to Radio Corporation of America, a corporation of Delaware Application November 30, 1956, Serial No. 625,268

15 Claims. (Cl. 250—20)

Figure 1:
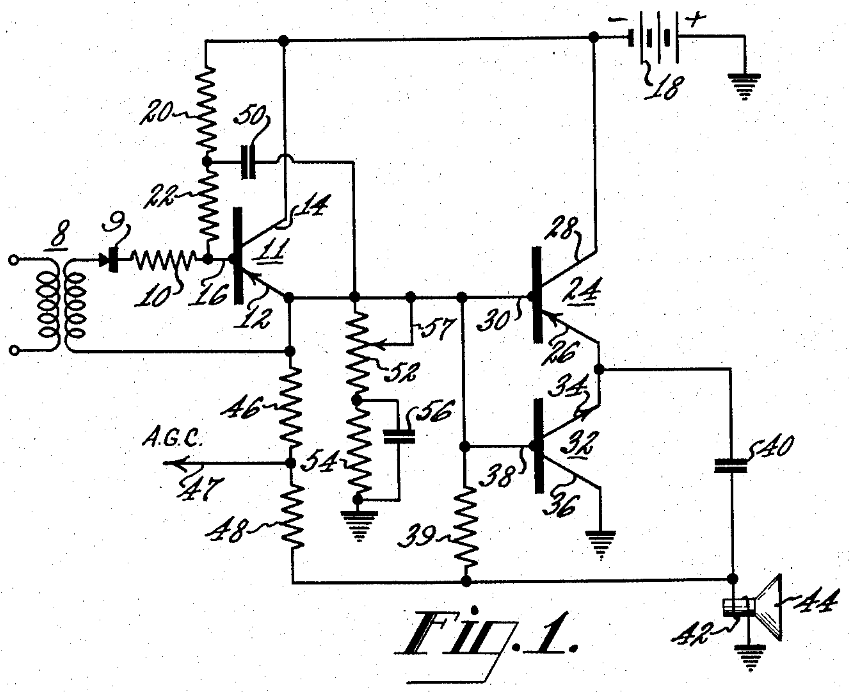

This invention relates to signal receiving systems of the type utilizing transistors as signal translating and amplifying elements, and in particular to signal receiving systems employing complementary transistors in the audio amplifier output stage.

Transistors, in contrast to tubes, are available in types having complementary electrical characteristics. The commercial availability of transistors of opposite conductivity types permits the circuit design of a class B push-pull circuit in which two transistors are in parallel for the input signal and in which no phase inverter is required. Thus the usual input transformer is not needed and circuit simplicity and economy are realized. This type circuit is known in the art as a complementary-symmetry push-pull amplifier.

Complementary-symmetry push-pull amplifiers may be of several configurations. One of these is the so-called common emitter configuration which is preferred for applications requiring high power gain. Another is the common collector configuration which is characterized by negative feedback and has low distortion characteristics. Separate negative feedback circuits may be provided for a common emitter push-pull amplifier but at the expense of relatively complicated circuitry and extra circuit components.

An object of this invention is to provide an improved complementary-symmetry transistor audio-frequency amplifier output stage for signal receivers and the like in which negative feedback is introduced in the output stage for low volume control settings of the receiver without the need of external feedback networks.

It is another object of this invention, to provide an improved complementary push-pull transistor amplifier circuit which is characterized by efficient and low distortion class B operation and is suitable for use as the audio-frequency amplifier output stage of a signal receiving system.

Yet another object of the the present invention is to provide an improved complementary-symmetry push-pull transistor amplifier circuit which is connected and arranged to effect the advantages of both the common collector and common emitter circuit configurations.

A complementary-symmetry push-pull output stage may be conveniently driven by a single driver transistor which is RC-coupled with the input electrodes of the complementary output transistors. With such a circuit, overload occurs simultaneously in the driver and output stages. This occurs because the reverse bias on the collector junction of the driver transistor is too small for hole or electron collection to take place during one half cycle of an applied signal. Thus the driver transistor "bottoms" on one half cycle of an applied signal and one of the output transistors "bottoms" on an opposite half cycle of an applied signal. This bottoming or clipping of the signal should be symmetrical in order to maintain circuit balance and provide maximum power output.

It is, therefore, a still further object of the present invention to provide an improved signal receiver audio amplifier output stage utilizing transistors of opposite conductivity types which provides symmetrical clipping of an applied signal and maximum power output.

In accordance with the invention, the volume control for a complementary-symmetry push-pull transistor output circuit is arranged so that the output transistors operate in the common emitter configuration at maximum or near maximum volume control settings and in the common collector configuration at minimum or near minimum volume control settings. Thus, 100% negative feedback is introduced in the output stage at reduced volume control settings, effecting substantially distortion free circuit operation under strong signal conditions. In addition, symmetrical clipping of the signal is obtained by arranging the volume control and AGC circuits such that the volume control reacts on the AGC circuit to provide an increase in the intermediate frequency signal level at the second detector as the volume control is advanced.

Figure 2:
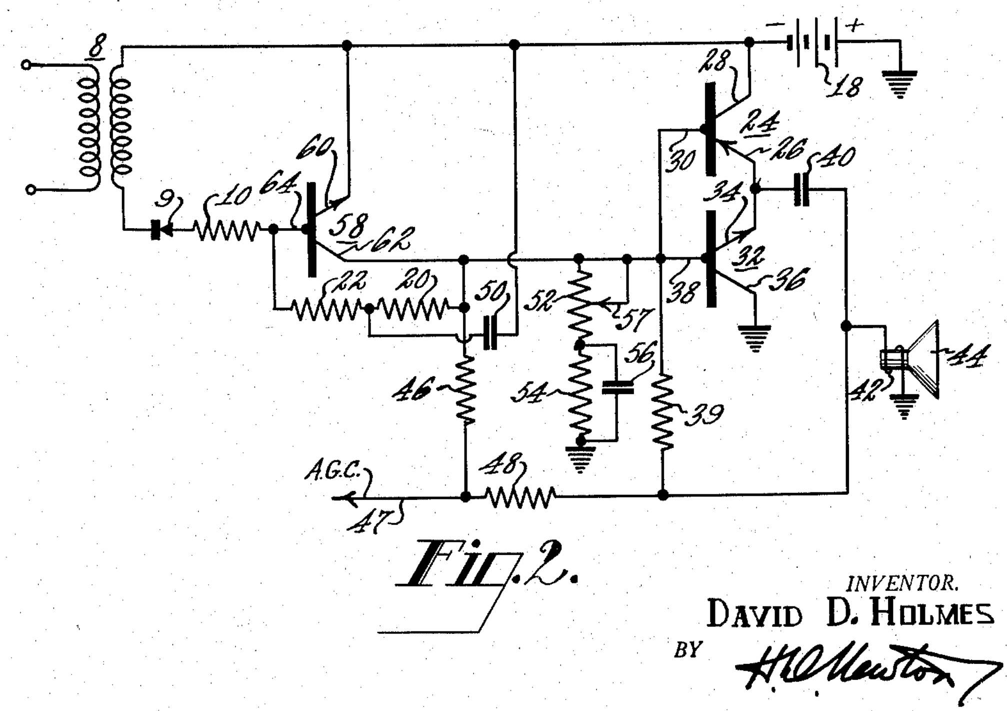
Figure 3:
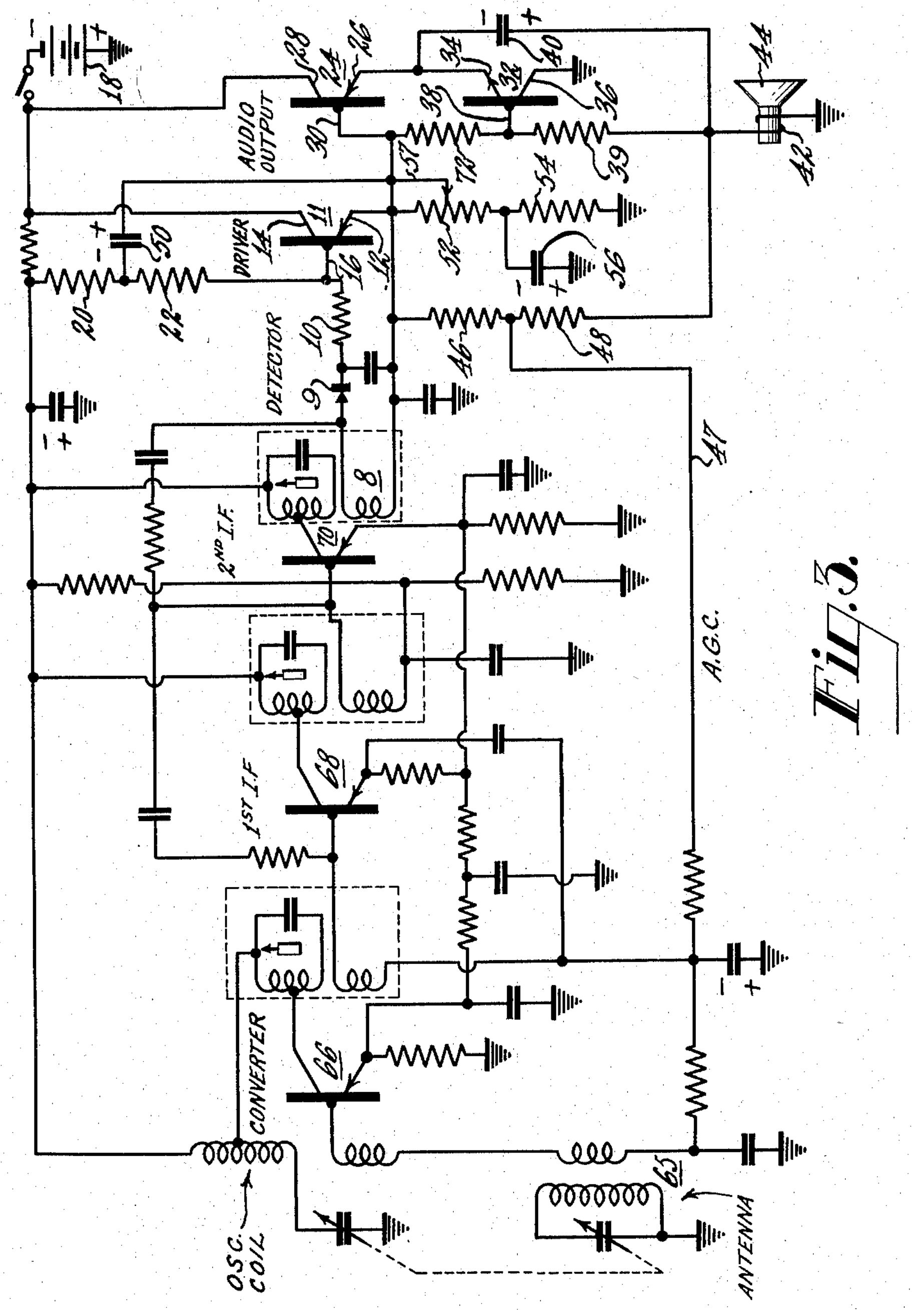

The novel features that are considered characteristic of this invention are set forth with particularity in the appended claims. The invention itself, however, both as to its organization and method of operation, as well as addition objects and advantages thereof, will best be understood from the following description when read in connection with the accompanying drawing, in which:

Figures 1 and 2 are schematic circuit diagrams of audio frequency amplifier circuits embodying the invention; and Figure 3 is a schematic circuit diagram of a radio signal receiver including an amplifier circuit as shown in Figure 1 as an output stage, in accordance with the invention.

Referring now to the drawing wherein like parts are indicated by like reference numerals throughout the figures and referring particularly to Figure 1, a signal, such as an intermediate frequency (I. F.) signal, is applied through an input transformer 8 to a diode detector 9, which is direct-current conductively connected through a series resistor 10 to the base 16 of a transistor 11. The transistor 11 may be of the P–N–P junction type and includes an emitter 12 and a collector 14. It serves in the circuit shown as the driver amplifier for an audio amplifier output stage and as an automatic gain control (AGC) amplifier. The diode detector 9 is also connected through the secondary winding of the input transformer 8 to the emitter 12 of the transistor 11, and is operative to separate the audio frequency signal component from the received I. F. signal. The detected audio frequency signal is then applied between the base 16 and the emitter 12 of the driver and AGC amplifier transistor 11. The input circuit of the transistor 11, that is, the base-emitter circuit, serves as the load for the diode detector 9. The diode detector 9 is poled in the circuit in a direction opposite to normal base-emitter current flow of the transistor 11 and provides some measure of temperature compensation for the transistor 11. The impedance of the diode varies with temperature to vary the base-emitter voltage of the transistor 11.

To supply biasing voltages for the transistor 11 and the diode 9, a direct-current supply source, such as a battery 18, is provided, the positive terminal of which is grounded. The negative terminal of the battery 18 is connected directly with the collector 14 and through a pair of bias resistors 20 and 22 and the coupling resistor 10 to the cathode of the diode detector 9. The battery 18 is poled to apply a reverse bias voltage to the collector 14 and to forward bias the diode detector 9.

The audio output stage includes a pair of transistors 24 and 32 which are of opposite conductivity types. The transistor 24 may be considered to be a junction transistor of the P–N–P type and includes an emitter 26, a collector 28, and a base 30. The transistor 32, on the other hand, may be considered to be a junction transistor of the N–P–N type and includes an emitter 34, a collector 36, and a base 38. The collector 28 of the transistor 24 is connected directly with the negative terminal of the battery 18 which biases the collector 28 in the reverse direction, while the collector 36 of the N–P–N transistor 32 is connected to a point of reference potential or circuit ground. The emitters 26 and 34 are connected together and through a coupling capacitor 40 to the voice coil 42 of a loudspeaker 44. The voice coil 42 in a typical case may have a resistance of 50 ohms. Base bias for the output transistors is provided by connecting the base electrodes 30 and 38 through a resistor 39 to the high voltage side of the loudspeaker voice coil 32.

The emitter 12 of the driver transistor 11 is direct-current conductively connected to the base electrodes 30 and 38 of the output transistors 24 and 32. The emitter 12 of the driver transistor 11 is also connected with the high signal voltage end of the loudspeaker voice coil 42 through a pair of resistors 46 and 48. These resistors are a portion of the load circuit for the driver transistor and serve to stabilize the circuit operation. In addition, an AGC voltage for the receiver may be taken from the junction of these resistors as indicated by the lead 47, and as described hereinafter. The bias arrangement for the driver transistor is such that if its collector current increases the voltage drop across the resistors 46 and 48 will increase. This will reduce (through the collector to base feedback circuit) the effective collector-to-base supply voltage. Thus the amount of forward bias applied to the base and emitters will be reduced. To prevent signal degeneration, the base bias supply is returned to the emitter for signals. This is accomplished by connecting a capacitor 50 from the junction of the base bias resistors 20 and 22 to the emitter 12 of the driver transistor 11.

Volume control is achieved while maintaining stable and substantially distortion free circuit operation, by connecting a shunt volume control resistor 52 in the emitter or output circuit of the driver transistor 11. The volume control resistor 52 is connected from the emitter 12 to ground through a resistor 54 which is signal by-passed by a capacitor 56. The resistor 54, which has a relatively low resistance value, serves to limit the increase of the direct collector current of the driver transistor 11 when the collector to base supply voltage of this transistor increases due to a reduction in the volume control. The capacitor 56 provides a tone compensating volume control since it is of a value to have a relatively poor by-pass characteristic for low frequency signals. To complete the circuit, a variable volume control tap 57 is connected from the volume control resistor 52 to the base electrodes 30 and 38 of the output transistors.

In operation, the intermediate frequency signal, which is applied through the input transformer 8, is detected by the diode 9 and the detected audio frequency signal is applied between the base 16 and the emitter 12 of the driver transistor 11. This signal is amplified and derived across the emitter load resistors 46 and 48 of the driver transistor. If it is assumed that the volume control resistor is set for maximum volume, that is the variable tap 57 is connected directly with the emitter 12 of the driver transistor 11, substantially all of the driver output signal current flows into the base electrodes 30 and 38 of the output transistors. At maximum or near maximum volume control settings, therefore, the resistance of the volume control is high compared to the parallel combination of the resistors 46, 48 and 39 so that the resistance of the volume control can be neglected. Thus the driver load resistance effectively returns to the high signal voltage side of the speaker coil 42 at maximum volume control settings. The output signal from the driver transistor 11 is applied between the base and emitter electrodes of each of the output transistors and the output signal is derived from between the emitter and collector electrodes of each of the output transistors. Thus for maximum volume control settings, the output stage transistors are operated as common emitter amplifiers, and there is no negative feedback in the output stage. Because of this arrangement, the signal coupling efficiency from the driver transistor 11 to the output transistors is relatively high and high power gain of the output transistors is realized.

At the minimum volume control setting, that is, when the variable tap 57 is connected to the junction of the volume control resistor 52 and the current limiting resistor 54, the signal from the driver transistor 11 is diverted to ground via the capacitor 56. At low volume control settings, therefore, the signal from the driver transistor 11 is applied between the base and collector electrodes of the output transistors, while the output signal is derived from between the emitter and collector electrodes. Thus the output transistors operate as common collector amplifiers for low volume control settings, which introduces negative feedback in the output stage since the output voltage is in series with the input signal voltage. The feedback is appreciable when the resistance of the volume control resistor 52 is comparable to or less than the resistance of the parallel combination of the resistors 46, 48, and 39 since the volume control returns to ground via the capacitor 56 rather than to the high voltage side of the loudspeaker voice coil 42. By connecting the volume control so that common collector operation is obtained at reduced volume control settings, an improvement in the distortion characteristics of the reecviver is obtained under strong signal conditions.

In order to provide symmetrical clipping of the signal at maximum output, the circuit arrangement is such that the I. F. signal which is applied to the detector diode 9 is of sufficient magnitude to permit the driver transistor 11 to bottom on negative peaks of the signal and the N–P–N output transistor 32 to bottom on positive peaks of the signal. The transistors 11 and 32 will bottom when the reverse bias on their collectors is too small for hole and electron collection to take place on negative and positive peaks of the signal, respectively. By connecting the volume control resistor 52 as described, it reacts on the AGC circuit such that as the volume control is increased, the I. F. signal level at the input to the diode 9 is increased. This occurs because advancement of the volume control tap on the volume control resistor 52 to a point near the emitter 12 of the driver transistor 11 (near maximum volume control resistance) produces an increase in the effective driver D.-C. load resistance. For a given driver current, then, the voltage at the driver emitter, and, therefore, the AGC voltage at the junction of resistors 46 and 48, becomes more negative as the volume control is advanced. This negative voltage is used to increase the gain of a prior I. F. amplifier stage. In this manner, the level of the I. F. signal which is applied to the second detector is increased as the volume control is advanced. The circuit is such that the direct voltage on the emitter 12 of the driver transistor 11 is kept at a value approximately equal to one half the battery voltage. The effect of the volume control is to provide increased signal to the driver transistor 11, and increased signal from the driver transistor 11 to the output stage, for maximum volume control settings. In this manner, a conventional "feel" is imparted to the volume control and symmetrical clipping of the signal can be obtained.

In Figure 2, an N–P–N junction transistor 58 is used as the driver for the push-pull output transistors 24 and 32. The transistor 58 includes an emitter 60, a collector 62 and a base 64 and is connected for common emitter operation. Thus the input circuit, including the secondary winding of the input transformer 8, the diode detector 9, and the coupling resistor 10, is connected between the emitter 60 and the base 64 of the driver transistor 58. The emitter 60 is connected directly with the negative terminal of the biasing battery 18, which applies forward bias to this electrode. The negative terminal of the battery is also connected through the secondary winding of the input transformer 8 to the cathode of the diode detector 9 and forward biases the detector. It is to be noted that since the driver transistor 58 is of P type conductivity, the polarity of the diode detector 9 is reversed from its polarity in Figure 1. The collector 62 or output electrode of the driver transistor 58 is directly connected with the base electrodes 38 and 30 of the output transistors 32 and 24, respectively. To stabilize the circuit operation of the driver transistor 58, the resistors 20 and 22 are connected directly between the collector 62 and the base 64. By this arrangement, variation in the collector voltage due to variation in collector current flow through the load resistor 46 will apply a corrective bias current through the resistors 20 and 22 to the base electrode 64. The circuit illustrated in Figure 2 is otherwise identical to the circuit illustrated in Figure 1 and is, by provision of the invention, characterized by the same advantages. It should be noted that the transistors used in the circuit of Figure 2 may each be of an opposite conductivity type to that illustrated, providing the polarity of the bias battery 18 is reversed.

In Figure 3, reference to which is now made, a superheterodyne radio signal receiving system provided with a volume control and AGC circuit embodying the invention includes an antenna 65, a converter 66, a first intermediate frequency (I. F.) amplifier transistor 68, a second I. F. amplifier transistor 70, the detector diode 9, the driver transistor 11, and an output stage including the pair of complementary transistors 24 and 32. The detector, driver, and output stages are of the same general type illustrated in Figure 1. A signal, which is received by the antenna 65, is coupled to the base electrode of the converter transistor 66. The oscillator portion of the converter circuit includes an oscillator coil which is connected to provide regenerative feedback between the collector and base electrodes of the converter transistor 66. The received signal and oscillator signal are thus mixed to provide an I. F. signal which is amplified by the first and second I. F. amplifier transistors 68 and 70. The amplified I. F. signal is then detected by the diode detector 9 and the detected audio frequency signal is applied to the base electrode 16 of the driver transistor 11.

As was mentioned hereinbefore, the detector, driver, and output stages are similar to the circuit illustrated in Figure 1. One difference is that the emitter electrode 12 of the driver transistor 11 is connected directly with the base 30 of the P–N–P output transistor 24 and through a small resistor 72 to the base 38 of the other output transistor 32. The resistor 72 is helpful in preventing crossover distortion by providing forward bias for the emitter-base electrodes of the output transistors due to the flow of driver emitter current through this resistor.

The AGC voltage which is derived from the junction of the resistors 46 and 48 is applied through the lead 47 to the base electrodes of the converter transistor 66 and the first I. F. transistor 68. If the signal strength increases, the emitter current of the driver transistor 11 decreases, making the voltage on the AGC lead 47 less negative. This results because the diode detector 9 is poled such that the base 16 becomes less negative with increases in signal strength. This less negative voltage on the AGC lead 47 will tend to decrease the emitter current in the converter and first I. F. transistors 66 and 68 which are both of N type conductivity, thus reducing their gain. It is through this connection, moreover, that the signal level at the second detector 9 is increased at maximum volume control setting. Thus if the volume control tap 57 is moved to a point near the emitter 12 of the driver transistor 11, current flow through the resistors 46 and 48 will increase making the voltage on the AGC lead 47 more negative. This negative voltage increases the forward bias on the converter and first I. F. transistors 66 and 68, increasing their gain and thus increasing the signal level at the second detector 9. The audio output stage for the receiver illustrated in Figure 3 operates as described in connection with Figure 1 and with the same advantages.

The following values may be used for the various circuit components, by way of example:

| | |
|---|---|
| Resistors **10, 20, 22, 39, 46, 48, 52, 54,** and **72** | 6,800; 10,000; 12,000; 3,300; 1,000; 680; 10,000; 560; and 130 ohms, respectively. |
| Capacitors **40, 50,** and **56** | 50; 16; and 16 microfarads, respectively. |
| Battery **18** | 13.5 volts. |
| Diode **9** | Commercial type 1N295. |
| Transistors **11** and **24** | Commercial type 2N109. |
| Transistor **32** | Commercial type 2N135. |

Transistor signal amplifying circuits embodying the invention are relatively simple in construction and characterized by relatively efficient and low distortion circuit operation. Because of these advantages, circuits embodying the invention are ideally suited for use in radio signal receiving systems.

What is claimed is:

1. A signal amplifier comprising, in combination, a push-pull amplifier stage including a pair of transistors of opposite conductivity types each including base, emitter, and collector electrodes, a driving stage including a driver transistor having an input, an output, and a third electrode, signal input means connected for applying an input signal to the input electrode of said driver transistor, coupling means connecting the output electrode of said driver transistor with the base electrodes of said pair of transistors, load impedance means for said push-pull amplifier stage including a pair of terminals, coupling means connecting the emitter electrodes of said pair of transistors with one terminal of said load impedance means, load impedance means for the driving stage connecting the output electrode of said driver transistor with said one terminal of the load impedance means for said push-pull amplifier stage, and volume-control variable resistance means connecting the output electrode of said driver transistor with the other terminal of the load impedance means for said push-pull amplifier stage to vary the signal output of said amplifier and provide common emitter operation at maximum volume control and common collector operation at minimum volume control of said pair of transistors.

2. A signal amplifier comprising, in combination, a push-pull amplifier circuit including a pair of transistors of opposite conductivity types each including base, emitter, and collector electrodes, of driving means for said push-pull circuit including a driver transistor having a base, an emitter, and a collector electrode, signal input means connected for applying an input signal to the base electrode of said driver transistor, coupling means connecting the emitter electrode of said driver transistor with the base electrodes of said pair of transistors, load impedance means for said push-pull circuit including a pair of terminals, coupling means connecting the emitter electrodes of said pair of transistors with one terminal of said load impedance means, load impedance means for said driver transistor connecting the emitter electrode of said driver transistor with said one terminal of the load impedance means for said push-pull circuit, and variable volume control means connecting the emitter electrode of said driver transistor with the other terminal of the load impedance means for said push-pull circuit to provide common emitter operation at maximum volume control and common collector operation at minimum volume control of said pair of transistors.

3. A signal amplifier comprising, in combination, a push-pull amplifier circuit including a pair of transistors of opposite conductivity types each including base, emitter, and collector electrodes, of driving means for said push-pull circuit including a driver transistor having a base, an emitter, and a collector electrode, signal input means connected for applying an input signal to the base electrode of said driver transistor, coupling means connecting the collector electrode of said driver transistor with the base electrodes of said pair of transistors, load impedance means for said push-pull circuit including a pair of terminals, coupling means connecting the emitter electrodes of said pair of transistors with one terminal of said load impedance means, load impedance means for said driving means connecting the collector electrode of said driver transistor with said one terminal of the load impedance means for said push-pull circuit, and variable volume control means connecting the collector electrode of said driver transistor with the other terminal of the load impedance means for said push-pull circuit to provide common emitter operation at maximum volume control and common collector operation at minimum volume control of said pair of transistors.

4. In a signal receiving system, the combination comprising, a push-pull audio-frequency amplifier stage including a first transistor of one conductivity type having base, emitter, and collector electrodes and a second transistor of an opposite conductivity type having base, emitter, and collector electrodes, a driving stage including a driver transistor of said one conductivity type having base, emitter, and collector electrodes, signal detection means connected between the base and emitter electrodes of said driver transistor and operative to apply a detected audio frequency signal thereto, at least one signal amplifying stage coupled with said signal detection means, coupling means connecting the emitter electrode of said driver transistor with the base electrodes of said first and second transistors, means providing a direct-current supply source including a pair of terminals, means connecting the collector electrodes of said first and driver transistors and said detection means with one terminal of said source and the collector electrode of said second transistor with the other terminal of said source, means providing a load impedance element for said push-pull stage having a pair of terminals, coupling means connecting the emitter electrodes of said first and second transistors with one terminal of said load impedance element, direct-current conductive resistive load impedance means connecting the emitter electrode of said driver transistor with said one terminal of said load impedance element, means connecting an intermediate point of said impedance means with said signal amplifying stage to control the gain thereof inversely with signal strength, a variable volume control resistor connected between the emitter electrode of said driver transistor and the other terminal of said load impedance element to vary the signal output of said receiving system and provide increased gain of said signal amplifying stage and common emitter operation of said first and second transistors for maximum volume control and common collector operation of said first and second transistors for minimum volume control.

5. In a signal receiving system the combination as defined in claim 4 wherein said signal amplifying stage is the first intermediate frequency amplifying stage of said system and includes a transistor of said one conductivity type having base, emitter, and collector electrodes.

6. In a signal receiving system the combination as defined in claim 5 wherein the intermediate point of said impedance means is connected with the base electrode of said intermediate frequency amplifying stage transistor.

7. In a signal receiving system, the combination comprising, a push-pull output stage including a first transistor of one conductivity type having base, emitter, and collector electrodes and a second transistor of an opposite conductivity type having base, emitter, and collector electrodes, a driving stage including a driver transistor of said opposite conductivity type having base, emitter, and collector electrodes, signal detection means connected between the base and emitter electrodes of said driver transistor and operative to apply a detected audio frequency signal thereto, at least one signal amplifying stage coupled with said signal detection means, coupling means connecting the collector electrode of said driver transistor with the base electrodes of said first and second transistors, means providing a direct-current supply source including a pair of terminals, means connecting the collector electrode of said first transistor, the emitter electrode of said driver transistor, and said detection means with one terminal of said source and the collector electrode of said second transistor with the other terminal of said source, means providing a load impedance element for said push-pull stage having a pair of terminals, coupling means connecting the emitter electrodes of said first and second transistors with one terminal of said load impedance element, direct-current conductive resistive load impedance means connecting the collector electrode of said driver transistor with said one terminal of said load impedance element, means connecting an intermediate point of said impedance means with said signal amplifying stage to control the gain thereof inversely with signal strength, a variable volume control resistor connected between the collector electrode of said driver transistor and the other terminal of said load impedance element to vary the signal output of said receiving system and provide increased gain of said signal amplifying stage and common emitter operation of said first and second transistors for maximum volume control and common collector operation of said first and second transistors for minimum volume control.

8. In a signal receiving system, the combination comprising, a class B push-pull output stage including a pair of transistors of opposite conductivity types each including base, emitter, and collector electrodes, a driving stage including a driver transistor having a base, an emitter, and a collector electrode, signal input means connected for applying an input signal to the base electrode of said driver transistor, coupling means connecting the emitter electrode of said driver transistor with the base electrodes of said pair of transistors, load impedance means for said output stage including a pair of terminals, means connecting the emitter electrodes of said pair of transistors with one terminal of said load impedance means, means including a pair of resistors connecting the emitter electrode of said driver transistor with said one terminal of said load impedance means, means connected with the junction of said pair of resistors for deriving an amplified automatic gain control voltage, volume-control variable resistance means connecting the emitter electrode of said driver transistor with the other terminal of said load impedance means to vary the signal output of said receiving system and provide common emitter operation at maximum volume control and common collector operation at minimum volume control of said pair of transistors.

9. In a signal receiving system the combination as defined in claim 8 wherein a frequency converter transistor and a first intermediate frequency transistor amplifier are provided and said automatic gain control voltage is applied to said converter and intermediate frequency amplifier transistors to control the gain thereof inversely with signal strength.

10. In a signal receiving system, the combination comprising, a push-pull audio-frequency output stage including a first transistor of one conductivity type having base, emitter, and collector electrodes and a second transistor of an opposite conductivity type having base, emitter, and collector electrodes, a driving stage including a driver transistor of said one conductivity type having base, emitter, and collector electrodes, signal detection means connected between the base and emitter electrodes of said driver transistor and operative to apply a detected audio frequency signal thereto, at least one signal amplifying transistor of said one conductivity type coupled with said signal detection means, coupling means connecting the emitter electrode of said dri er transistor with the base electrodes of said first and second transistors, means providing a direct-current supply source including a pair of terminals one of which is connected to a point of reference potential in said system, means connecting the collector electrodes of said first and driver transistors and said detection means with the other terminal of said source, means connecting the collector electrode of said second transistor with said point of reference potential, means providing a load impedance element having a pair of terminals one of which is connected to said point of reference potential, coupling means connecting the emitter electrodes of said first and second transistors with the other terminal of said load impedance element, direct-current conductive resistive load impedance means connecting the emitter electrode of said driver transistor with said other terminal of said load impedance element, means connecting an intermediate point of said impedance means with said signal amplifying transistor to control the gain thereof inversely with signal strength, a volume control resistor and a current limiting resistor connected in the order named between the emitter electrode of said driver transistor and said point of reference potential, a by-pass capacitor connected from the junction of said volume control and current limiting resistors to said point of reference potential, and means including a variable tap on said volume control resistor for varying the resistance thereof to vary the volume of said receiving system and provide increased gain of said signal amplifying stage and common emitter operation of said first and second transistors for maximum volume control and common collector operation of said first and second transistors for minimum volume control.

11. A signal amplifier comprising, in combination, a class B push-pull circuit including a pair of transistors of opposite conductivity types each including base, emitter, and collector electrodes, of driving means for said circuit including a driver transistor having an input, an output, and a third electrode, signal input means connected for applying an input signal to the input electrode of said driver transistor, coupling means connecting the output electrode of said driver transistor with the base electrodes of said pair of transistors, load impedance means for said push-pull circuit including a pair of terminals, coupling means connecting the emitter electrodes of said pair of transistors with one terminal of said load impedance means, load impedance means for said driving means connecting the output electrode of said driver transistor with said one terminal of the load impedance means for said push-pull circuit, and variable volume control means connecting the output electrode of said driver transistor with the other terminal of the load impedance means for said push-pull circuit to provide class B common emitter operation at maximum volume control and class B collector operation at minimum volume control of said pair of transistors.

12. In a signal receiving system, the combination comprising, a push-pull audio-frequency output stage including a first transistor of one conductivity type having base, emitter, and collector electrodes and a second transistor of an opposite conductivity type having base, emitter, and collector electrodes, a driving stage including a driver transistor having an input, an output, and a third electrode, signal detection means connected with the input electrode of said driver transistor and operative to apply a detected audio frequency signal thereto, at least one signal amplifying stage coupled with said signal detection means, coupling means connecting the output electrode of said driver transistor with the base electrodes of said first and second transistors, means providing a direct-current supply source including a pair of terminals, means connecting the collector electrode of said first transistor, the third electrode of said driver transistor, and said signal detection means with one terminal of said source and the collector electrode of said second transistor with the other termin l of said source, means providing a load impedance element having a pair of terminals, coupling means connecting the emitter electrodes of said first and second transistors with one terminal of said load impedance element, direct-current conductive resistive load impedance means connecting the output electrode of said driver transistor with said one terminal of said load impedance element, means connecting an intermediate point of said impedance means with said signal amplifying stage to control the gain thereof inversely with signal strength, and a variable volume control resistor connected between the output electrode of said driver transistor and the other terminal of said load impedance element to vary the signal output of said receiving system and provide increased gain of said signal amplifying stage and common emitter operation of said first and second transistors for maximum volume control and common collector operation of said first and second transistors for minimum volume control.

13. In a signal receiving system, the combination comprising, a class B push-pull output stage including a pair of transistors of opposite conductivity types each including base, emitter, and collector electrodes, a driving stage including a driver transistor having a base, an emitter, and a collector electrode, signal input means connected for applying an input signal to the base electrode of said driver transistor, coupling means providing a direct current conductive connection between the emitter electrode of said driver transistor and the base electrodes of said pair of transistors, load impedance means for said output stage including a pair of terminals, coupling means connecting the emitter electrodes of said pair of transistors with one terminal of said load impedance means, resistive direct-current conductive means connecting the emitter electrode of said driver transistor with said one terminal of said load impedance means, a volume control resistor and a current limiting resistor connected between the emitter electrode of said driver transistor and the other terminal of said load impedance means, a by-pass capacitor connected from the junction of said volume control resistor and said current limiting resistor to the other terminal of said load impedance means, and means for varying the resistance of said volume control resistor to vary the signal output of said receiving system and provide common emitter operation at maximum volume control and common collector operation at minimum volume control of said pair of transistors.

14. In a signal receiving system, the combination comprising, a class B push-pull audio-frequency output stage including a first transistor of one conductivity type having base, emitter, and collector electrodes and a second transistor of an opposite conductivity type having base, emitter, and collector electrodes, a driving stage including a driver transistor having an input, an output, and a third electrode, a diode detector connected with the input electrode of said driver transistor and operative to apply a detected audio frequency signal thereto, at lesat one signal amplifying stage coupled with said diode detector, coupling means connecting the output electrode of said driver transistor with the base electrodes of said first and second transistors, means providing a direct-current supply source including a pair of terminals one of which is connected to ground in said system, means connecting the collector electrode of said first transistor, the third electrode of said driver transistor, and said diode detector with the other terminal of said source and the collector electrode of said second transistor with ground, means providing a load impedance element having a pair of terminals one of which is connected to ground, coupling means connecting the emitter electrodes of said first and second transistors with the other terminal of said load impedance element, direct-current conductive resistive impedance means connecting the output electrode of said driver transistor with said other terminal of said load impedance element, means connecting an intermediate point of said impedance means with said signal amplifying stage to control the gain thereof inversely with signal strength, a volume control resistor connected between the output electrode of said driver transistor and ground, and means including a variable tap on said volume control resistor for varying the resistance of said volume control resistor to vary the signal output of said receiving system and provide increased gain of said signal amplifying stage and class B common emitter operation of said first and second transistors for maximum volume control and class B common collector operation of said first and second transistors for minimum volume control.

15. In a signal receiving system, the combination comprising, a push-pull output stage including a first transistor of one conductivity type having base, emitter, and collector electrodes and a second transistor of an opposite conductivity type having base, emitter, and collector electrodes, a driving stage including a driver transistor having an input, an output, and a third electrode, a signal detector connected between the input and output electrodes of said driver transistor and operative to apply a detected signal thereto, coupling means connecting the output electrode of said driver transistor with the base electrodes of said first and second transistors, means providing a direct-current supply source including a pair of terminals, means connecting the collector electrode of said first transistor, the third electrode of said driver transistor, and said signal detector with one terminal of said source and the collector electrode of said second transistor with the other terminal of said source, means providing a load impedance element having a pair of terminals one of which is connected to the same point in said system as the other terminal of said supply source, means connecting the emitter electrodes of said first and second transistors with the other terminal of said load impedance element, resistive impedance means connecting the output electrode of said driver transistor with the other terminal of said load impedance element, means connected with an intermediate point of said impedance means to derive an automatic gain control voltage, and volume-control variable resistance means connected between the output electrode of said driver transistor and said one terminal of said load impedance element to provide common emitter operation of said first and second transistors for maximum volume control and common collector operation of said first and second transistors for minimum volume control.

References Cited in the file of this patent

UNITED STATES PATENTS 2,789,164 Stanley ---------------- Apr. 16, 1957

OTHER REFERENCES

Pub. I., I. R. E. Convention Record, March 22–25, 1954, part 7, page 14, Fig. 7.